United States Patent
Vivio et al.

(10) Patent No.: US 12,105,569 B2
(45) Date of Patent: Oct. 1, 2024

(54) LOW TEMP POWER STATE HANDLING

(71) Applicant: Dell Products L.P., Round Rock, TX (US)

(72) Inventors: Joseph Andrew Vivio, Seattle, WA (US); Ayedin Nikazm, Austin, TX (US); Tyler Baxter Duncan, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 184 days.

(21) Appl. No.: 17/577,602

(22) Filed: Jan. 18, 2022

(65) Prior Publication Data

US 2023/0229214 A1      Jul. 20, 2023

(51) Int. Cl.
| | |
|---|---|
| *G06F 1/26* | (2006.01) |
| *G01K 1/14* | (2021.01) |
| *G01K 3/00* | (2006.01) |
| *G01K 7/02* | (2021.01) |
| *G05D 23/19* | (2006.01) |
| *H05K 7/20* | (2006.01) |

(52) U.S. Cl.
CPC .............. *G06F 1/26* (2013.01); *G01K 1/14* (2013.01); *G01K 3/005* (2013.01); *G01K 7/02* (2013.01); *G05D 23/193* (2013.01); *H05K 7/20836* (2013.01)

(58) Field of Classification Search
None
See application file for complete search history.

(56) References Cited

U.S. PATENT DOCUMENTS

| | | | | |
|---|---|---|---|---|
| 5,590,061 | A * | 12/1996 | Hollowell, II | G06F 1/206 714/24 |
| 9,736,887 | B2 * | 8/2017 | Chiu | H05B 1/0227 |
| 10,935,830 | B1 * | 3/2021 | Cho | G02F 1/13306 |
| 2006/0214639 | A1 * | 9/2006 | Miwa | H02J 7/007194 320/134 |
| 2011/0296155 | A1 * | 12/2011 | Belady | G06F 9/44 713/300 |
| 2013/0098891 | A1 * | 4/2013 | Chiu | G06F 1/206 219/486 |
| 2013/0103900 | A1 * | 4/2013 | Chiu | G06F 11/3058 711/112 |
| 2016/0323673 | A1 * | 11/2016 | Peng | H04R 9/06 |

(Continued)

FOREIGN PATENT DOCUMENTS

CN       102929670 A   *   2/2013

OTHER PUBLICATIONS

International Search Report and Written Opinion mailed May 12, 2023 for corresponding PCT Application No. PCTUS2023010732 filed Jan. 13, 2023. (9 pages).

*Primary Examiner* — Phil K Nguyen
(74) *Attorney, Agent, or Firm* — Chamberlain, Hrdlicka, White, Williams & Aughtry; Aly Z. Dossa (57) ABSTRACT

An improved method and system for controlling the powering-on of an electronic device when initially the internal temperature is below a safe threshold. The method and system can preheat the electronic device until it is at a safe temperature in which to safely power-on the electronic device. Alternatively or in addition, the method and system can alert a user if the temperature is below a threshold and proceed to power-on when the temperature is above the threshold.

9 Claims, 6 Drawing Sheets

(56) References Cited

U.S. PATENT DOCUMENTS

2020/0098658 A1* 3/2020 Pinkham ................. G05D 23/30
2023/0176873 A1* 6/2023 Wu ........................... G06F 1/00
                                                        713/1

* cited by examiner

LOW TEMP POWER STATE HANDLING

BACKGROUND

As networking and communication technologies advance, there is an increased need for providing datacenters closer to the end users or on the "Edge". These datacenters are typically smaller than that of large "Cloud" based datacenters, but still have requirements that are similar to those of large Cloud based datacenters.

The information handling system mounted in the datacenters are generally designed for a 10° C. to 35° C. environment. However, edge datacenters often have minimal to no heating or cooling capabilities. This can result in information handling systems needing to operate below or above the range which they are designed for, and can be harmful to components such as processors in the information handling system. Potentially, if the information handling system is operated outside of the range it is designed for, device failures can occur and/or permanent physical damage to components of the information handling system can occur.

SUMMARY

Embodiments of the present invention provide a method and system for controlling the powering-on of an electronic device when initially the internal temperature is below a safe threshold. The method and system can preheat the electronic device until it is at a safe temperature in which to safely power-on the electronic device. Alternatively or additionally, the method and system can alert a user if the temperature is below a threshold and proceed to power-on the system when the temperature is above the threshold.

In accordance with the first aspect, the present invention provides a method for preheating an electronic device. The method includes measuring an internal temperature of the electronic device and determining that the internal temperature is below a first threshold. In response to determining that the internal temperature is below the first threshold, preheating the electronic device. The electronic device is then preheated until the temperature is above the first threshold and then the electronic device is powered on.

In accordance with the second aspect, the present invention provides an electronic device comprising at least one sensor for determining an internal temperature. The electronic device further includes a processor that controls the electronic device and a memory having computer program instructions stored thereon. The processor executes the computer program instructions in the memory to perform a method. The method includes measuring an internal temperature of the electronic device and determining that the internal temperature is below a first threshold. In response to determining that the internal temperature is below the first threshold, preheating the electronic device. The electronic device is then preheated until the temperature is above the first threshold and then the electronic device is powered on.

In accordance with the third aspect, it provides a method for powering on an electronic device. The method includes receiving an indication that external power has been restored to the electronic device. When the indication has been received, an ambient temperature associated with the electronic device is measured. If the ambient temperature is within a predetermined range, the method performs a normal system power-on. Otherwise the method alerts a user and/or environmental manager when the ambient temperature is outside a predetermined range.

In accordance with the fourth aspect, the present invention provides an electronic device comprising at least one sensor for determining an internal temperature. The electronic device further includes a processor that controls the electronic device and a memory that has computer program instructions stored thereon. The processor executes the computer program instructions in the memory to perform a method. The method includes receiving an indication that external power has been restored to the electronic device. When the indication has been received, an ambient temperature associated with the electronic device is measured. If the ambient temperature is within a predetermined range, the method performs a normal system power-on. Otherwise the method alerts a user and/or environmental manager when the ambient temperature is outside a predetermined range.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a front view of a diagram of an information handling system in accordance with one or more embodiments of the invention.

FIG. 1.2 shows a side view of an information handling system in accordance with one or more embodiments of the invention.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regards to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an electronic device. In at least one embodiment, the electronic device is an information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may be exposed to external environmental/ambient air or gasses which may be at various temperatures including outside of an operational temperature range. When the temperature is outside of the operational temperature range, many of the components can be damaged if they are operated, without making adjustments or providing heating or cooling as appropriate. Without proper heating and cooling, over time, this may cause the components to fail prior to the computing devices meeting their expected service life.

Embodiments of the invention may provide methods and systems to actively monitor the internal temperatures associated with an electronic device and make corresponding changes to the operation of the various components making up the electronic devices. To determine when the internal temperatures are outside of a preferred range, monitoring circuits will monitor the temperature inside the housing and/or outside ambient temperature either with at least one temperature sensor.

By determining ambient temperatures and internal temperatures associated with the electronic devices, it can be determined if it is safe to power on the electronic device. In at least some embodiments when the internal temperature is below a threshold the system can preheat the electronic device, prior to performing normal system power on. By doing so, system failure can be avoided and the components forming the electronic device may be less likely to prematurely fail, and the device may be able to operate in less than ideal environmental conditions while maintaining proper functioning of the electronic device.

Figure 11:
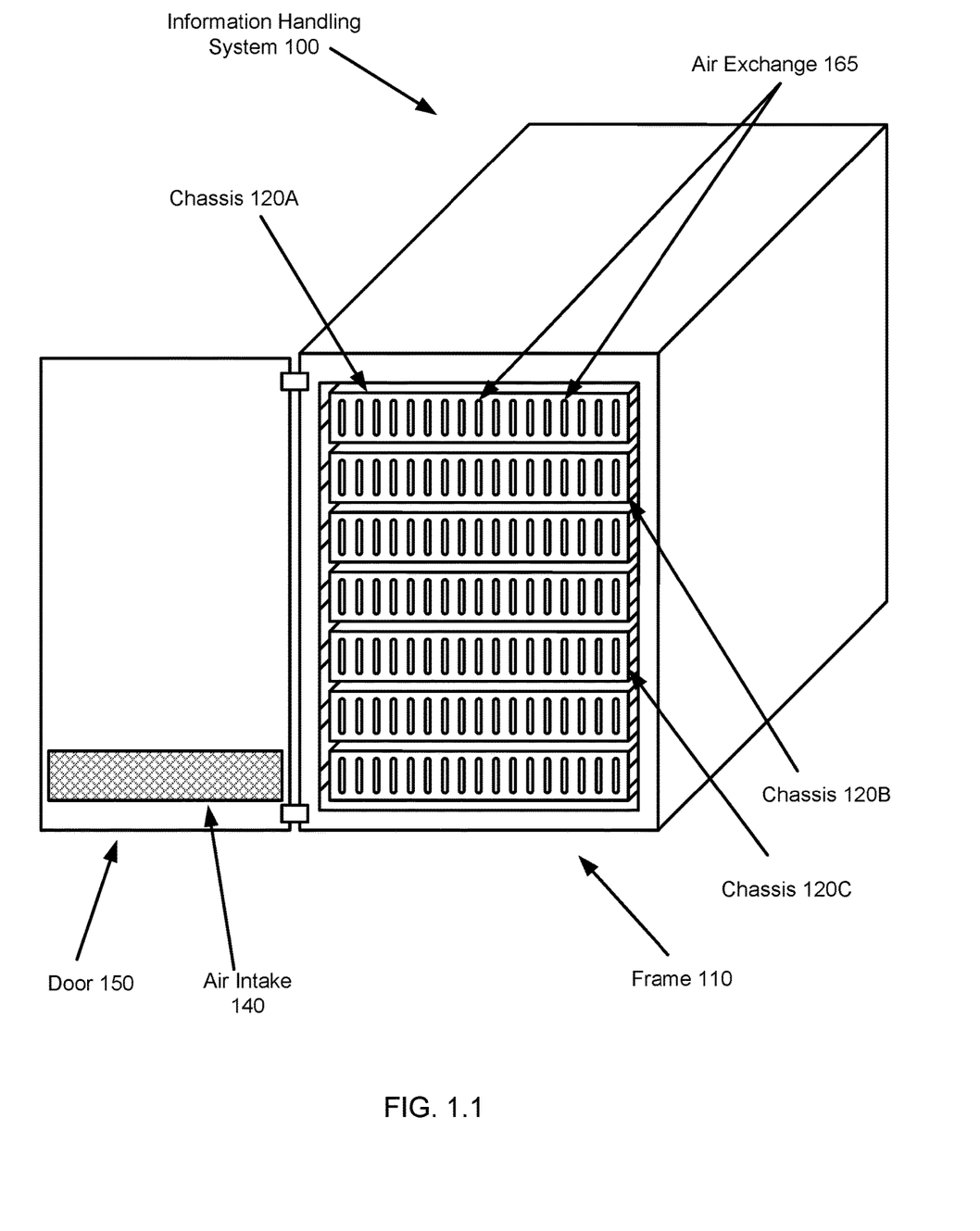
Figure 12:
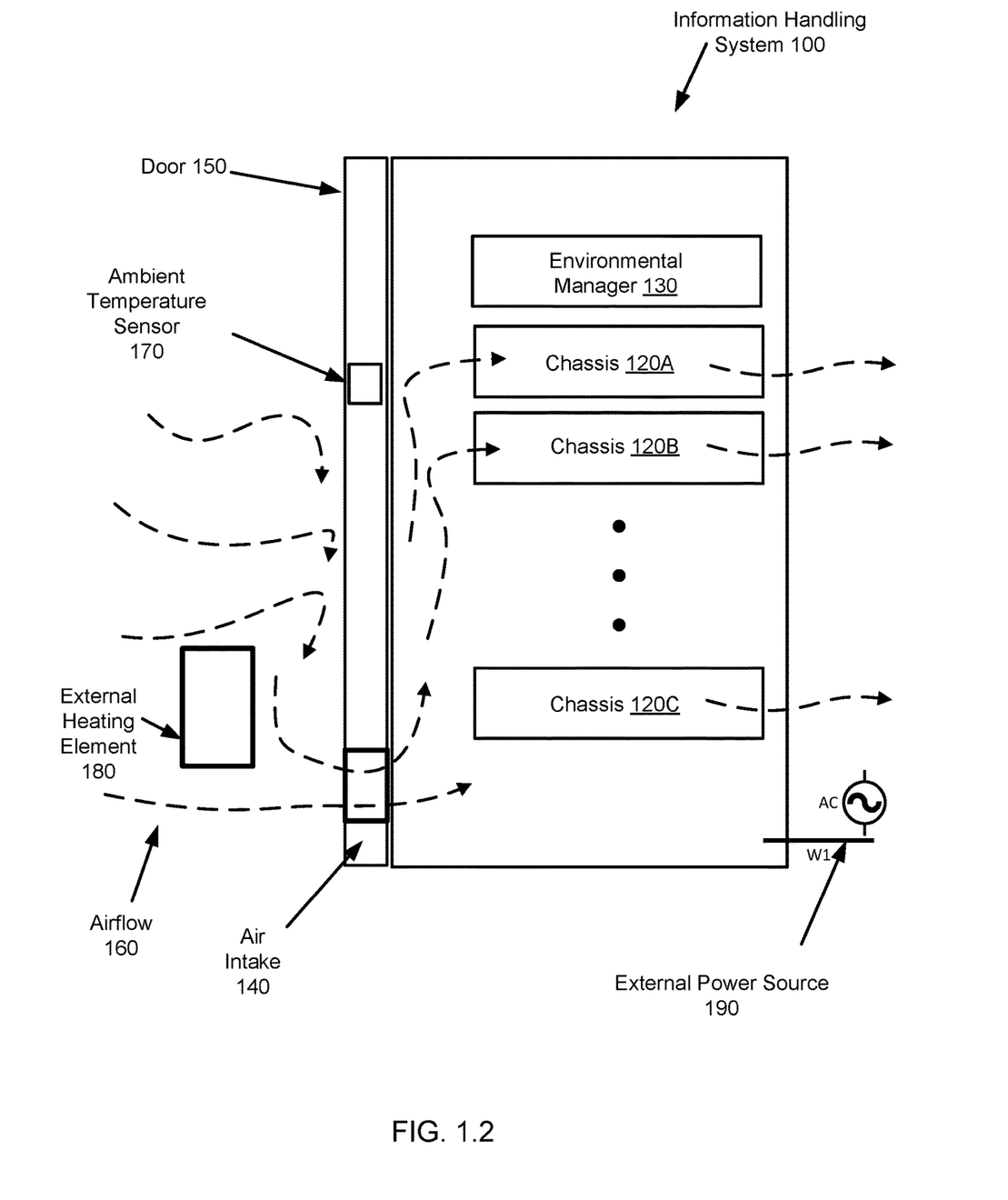

FIG. 1.1 shows the front of an information handling system (100) in accordance with one or more embodiments of the invention and FIG. 1.2 shows a side view of an information handling system (100) in accordance with one or more embodiments of the invention. The system may include a frame (110) and any number of chassis (e.g., 120A, 120B, 120C).

The frame (110) may be a mechanical structure that enables multiple chassis (120A-120C) to be positioned with respect to one another. The mechanical structure of the frame (110) can include a door (150) that includes an air intake (140) for providing external ambient air to the chassis (120A) mounted within the frame (110).

The information handling system (100) can take many forms. For example, the frame (110) may be a rack mount enclosure that enables the chassis (120A) to be disposed within it.

The frame (110) may be implemented as other types of structures adapted to house, position, orient, and/or otherwise physically, mechanically, electrically, and/or thermally manage chassis. By managing the chassis, the frame (110) may enable multiple chassis (120A) to be densely packed in space without negatively impacting the operation of the information handling system (100).

A chassis (e.g., 120A) may be a mechanical structure for housing components of an information handling system. For example, a chassis (120A) may be implemented as a rack mountable enclosure for housing components of an information handling system. The chassis may be adapted to be disposed within the frame (110) and/or utilize services provided by the frame (110) and/or other devices. Any number of components may be disposed in each of the respective chassis (e.g., 120A, 120B, 120C).

The system can also include an external power source (190). The external power source (190) can take any forms and in one embodiment it is electrical power provided by an electrical utility. In other embodiments it may take the form of on-site power generators, including backup fossil-fuel burning generators, solar panels, wind energy, and other sources of power for operating computing components. The generating components of the external power source can be located near to the information handling system (100) or deliver power to the information handling system (100) over transmission means from off-site locations.

The system may further include an ambient temperature sensor (170), which can be mounted within the frame such as in the door (150) as shown. It can alternatively, or in addition, be mounted outside of the information handling system (100) such as, but not limited to, in the airflow (160), in the various chassis (120A), in the air intake (140), or other components within such as an environmental manager (130) and backup power supply (not shown).

Alternatively, according to some embodiments, the system may not include an ambient temperature sensor. The system in these embodiments can obtain ambient temperatures from external sources networked with the information handling system (100). These can be from temperature sensors associated with an enclosure (not shown) housing one or more information handling systems (100). Alternatively, they can be provided by an information service that provides weather data and/or forecasts associated with the location where the information handling system (100) is disposed.

The system can also include an external heating element (180). This element is provided to heat the airflow (160) prior to entering the information handling system (100). This heating element can be part of the HVAC system of the enclosure housing the information handling system (100) or can take various forms such as space heaters in the enclosure, heating elements positioned in the air intake (140), or other heating elements that are capable of heating the airflow (160) and/or internal environment/voluem of the information handling system (100).

To maintain the temperatures of the components in the chassis or the information handling system in general, within a nominal range, external airflow (160), such as ambient air may be taken in through an air intake (140). The gases forming the external air may be passed to the chassis (120A) to cool or heat the components therein. The heated gases may then be expelled out of another opening (not shown) in the housing of the information handling system (100).

When the components of an information handling system provide computer implemented services, the components may generate heat. For example, the components may utilize electrical energy to perform computations and generate heat as a byproduct of performing the computations. If left unchecked, buildup of heat within a chassis may cause temperatures of the components disposed within the chassis to exceed preferred ranges.

The preferred ranges may include a nominal range in which the components respectively operate (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred (nominal) range, the service life of the component may be reduced. The component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include air exchanges (e.g., 165). An air exchange (165) may be one or more openings in an exterior of a chassis that enables the chassis to exchange gases such as air with an ambient environment. For example, a chassis may utilize air exchanges to (i) vent hot air and (ii) intake cool air. By doing so, the temperature of the air within the chassis may be reduced. Consequently, the temperatures of components within the chassis may be reduced by utilizing the cooler gases taken into the chassis via an air exchange.

In an example, the ambient gases and/or the internal environment of the information handling system (100) may be too cold. This can be detrimental to many of the components. For example, below a certain temperature normal transistor operation of processors can be negatively affected. Further, other components such as batteries can fail and rupture at significantly low temperature.

To address the above and/or other potential issues, electronic devices such as an information handling system (100) rely on heating and cooling systems to maintain the proper temperature. Yet in many telecom and edge applications (as non-limiting examples), heating and cooling systems are either not present, or are not sufficient for extreme weather. Also, when external power is loss, it is possible that the heating and cooling systems (when present) will no-longer function, leading to any device powered by a back-up power system including the back-up power system to be subject to ambient temperatures.

Figure 2:
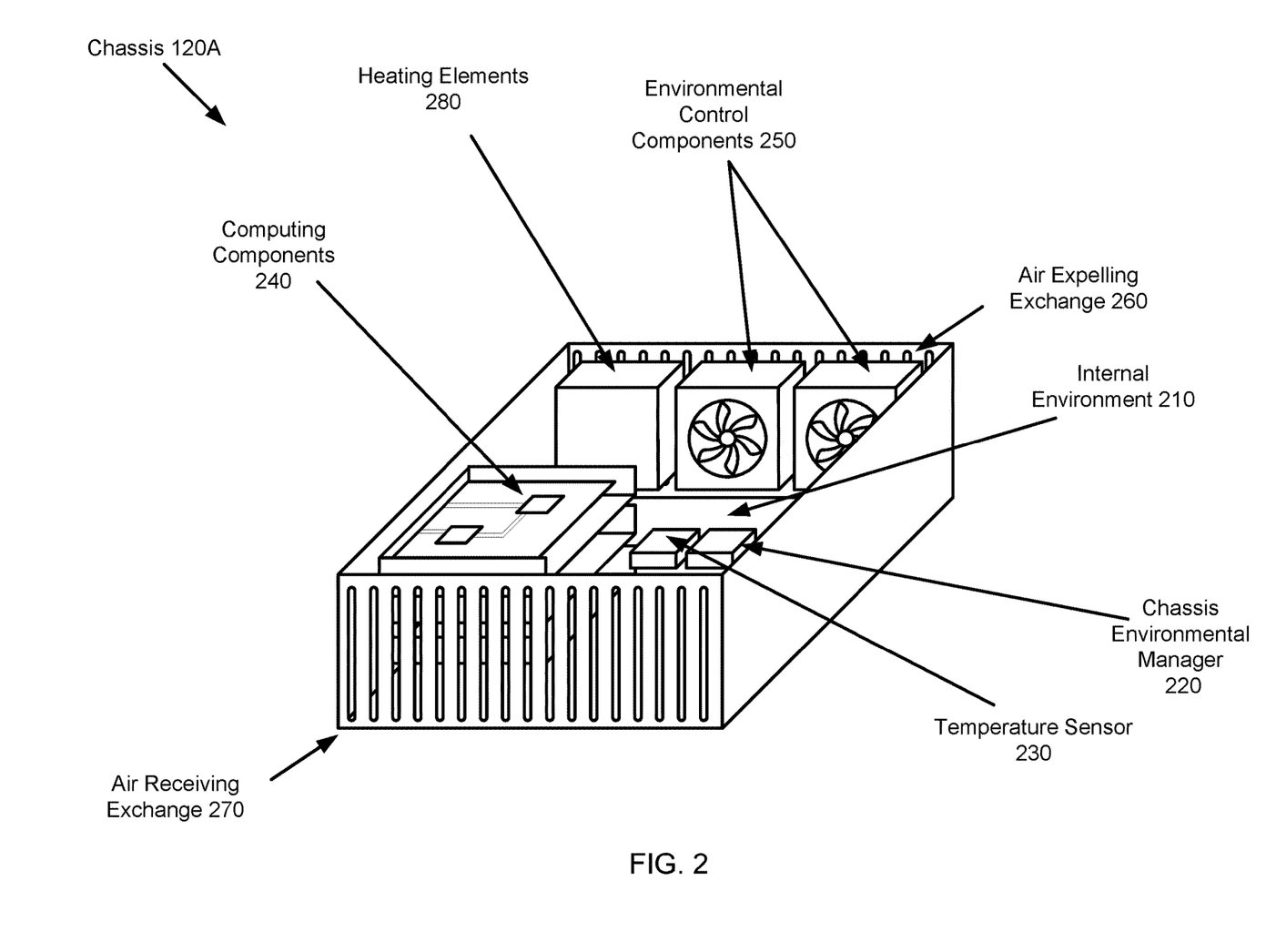
FIG. 2 shows a diagram of a chassis of an information handling system in accordance with one or more embodiments of the invention.

To further clarify the processes of managing the internal temperature within an electronic device such as a chassis, a diagram of an exemplary chassis is illustrated in FIG. 2.

FIG. 2 shows a diagram of a chassis (120A) in accordance with one or more embodiments of the invention. A chassis (120A) may be a portion of an information handling system (100) and/or house all, or a portion, of an information handling system (see FIG. 1). An information handling system may include a computing device that provides any number of services (e.g., computing implemented services). To provide services, the computing device may utilize computing resources provided by computing components (240). The computing components (240) may include, for example, processors, memory modules, storage devices, special purpose hardware, and/or other types of physical components that contribute to the operation of the computing device. For additional details regarding computing devices, refer to FIG. 5.

While the chassis (120A) of FIG. 2 has been illustrated as including a limited number of specific components, a chassis in accordance with one or more embodiments of the invention may include additional, fewer, and/or different components without departing from the invention. Additionally, while the chassis (120A) is illustrated as having a specific form factor (e.g., rack mount), a chassis in accordance with embodiments of the invention may have different form factors without departing from the invention including as a device that can operate by itself with or without a frame (FIG. 1, 110).

As discussed above, the chassis (120A) may house computing components (240). The computing components (240) may enable computing devices to provide services, as discussed above. The computing components (240) may include, for example, packaged integrated circuits (e.g., chips). The computing components (240) may enable any number and type of functionalities to be performed by a computing device.

In one or more embodiments disclosed herein, the computing components (240) include storage that is implemented using devices that provide data storage services (e.g., storing data and providing copies of previously stored data). The devices that provide data storage services may include hardware devices and/or logical devices. For example, storage may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, the computing components (240) may include a memory device (e.g., a dual in line memory device) in which data is stored and from which copies of previously stored data are provided. In another example, the computing components (240) may include a persistent storage device (e.g., a solid state disk drive) in which data is stored and from which copies of previously stored data are provided. In another example, computing components (240) may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Computing components may consume electrical power and generate heat as a byproduct of performing their functionality. Further, the computing components (240) may have some sensitivity to temperature. For example, the computing components (240) may only operate nominally (e.g., as designed) when the temperatures of the respective components (240) are maintained within a preferred temperature range. Consequently, all, or a portion, of the computing components (240) may require some level of cooling and/or heating to continue to operate nominally.

Because the computing device uses computing components (240) to provide services, the ability of the computing device to provide services is limited based on the number and/or quantity of computing devices that may be disposed within the chassis. For example, by adding additional processors, memory modules, and/or special purpose hardware devices, the computing device may be provided with additional computing resources which may be used to provide services. Consequently, a large number of computing components that each, respectively, generate heat may be disposed within the chassis.

To maintain the temperatures of the computing components (240) (and/or other types of components) within a nominal range, external air such as ambient air may be taken in through an air receiving exchange (270). The gases forming the external air may be passed by the computing components (240) to exchange heat with them. The heated gases may then be expelled out of another air exchange such as an air expelling exchange (260).

The gases forming the external air are moved by environmental control components (250). The environmental control components (250) may include gas movers such as fans. The fans may be able to modify the rate of gases being taken into and expelled from the chassis (120A) through the air exchangers (e.g., 270 and 260). The rate of intake and expelling of gases may cause an airflow to be generated within the internal environment (210). The airflow may be used to modify the rate of thermal exchange between the computing components (240) and the internal environment (210) (e.g., an environment proximate to the computing components (240)).

The gases and/or the computing components (240) can additionally be heated by the use of a heating element (280). While the heating element (280) is shown as a stand-alone device mounted with other environmental control components (250), it can take many forms and can also comprise of multiple heating devices. In at least one embodiment the heating element (280) can take the form of a heating device mounting on the surface of the computing components (240). The heating element (280) may cover all of the computing components (240) or a select few that are more cold sensitive. The heating element can alternatively or in addition be part of the environment control components (250) mounted to heat the air that the fans making up the environmental control elements draw in or expel.

In one embodiment, the heating element (280) is designed to preheat the computing components (240) and/or other components of the chassis (120A) when the internal temperature is below a threshold. The internal temperature is determined by a temperature sensor (230) which may take a variety of forms such as a thermocouple or other varieties of thermometers.

Figure 3:
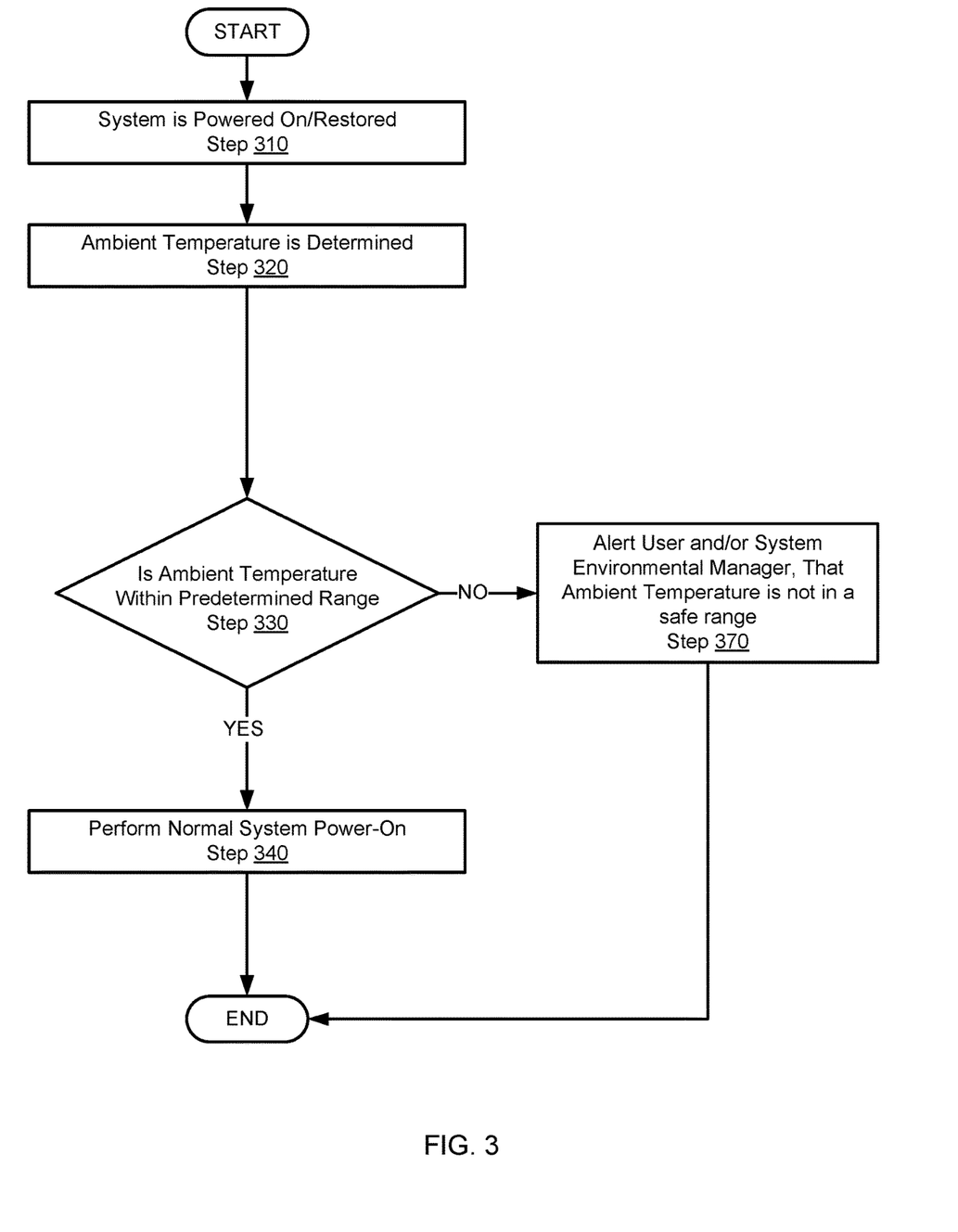
FIG. 3 shows a flowchart of a method determining if the ambient temperature is in a safe range.
Figure 4:
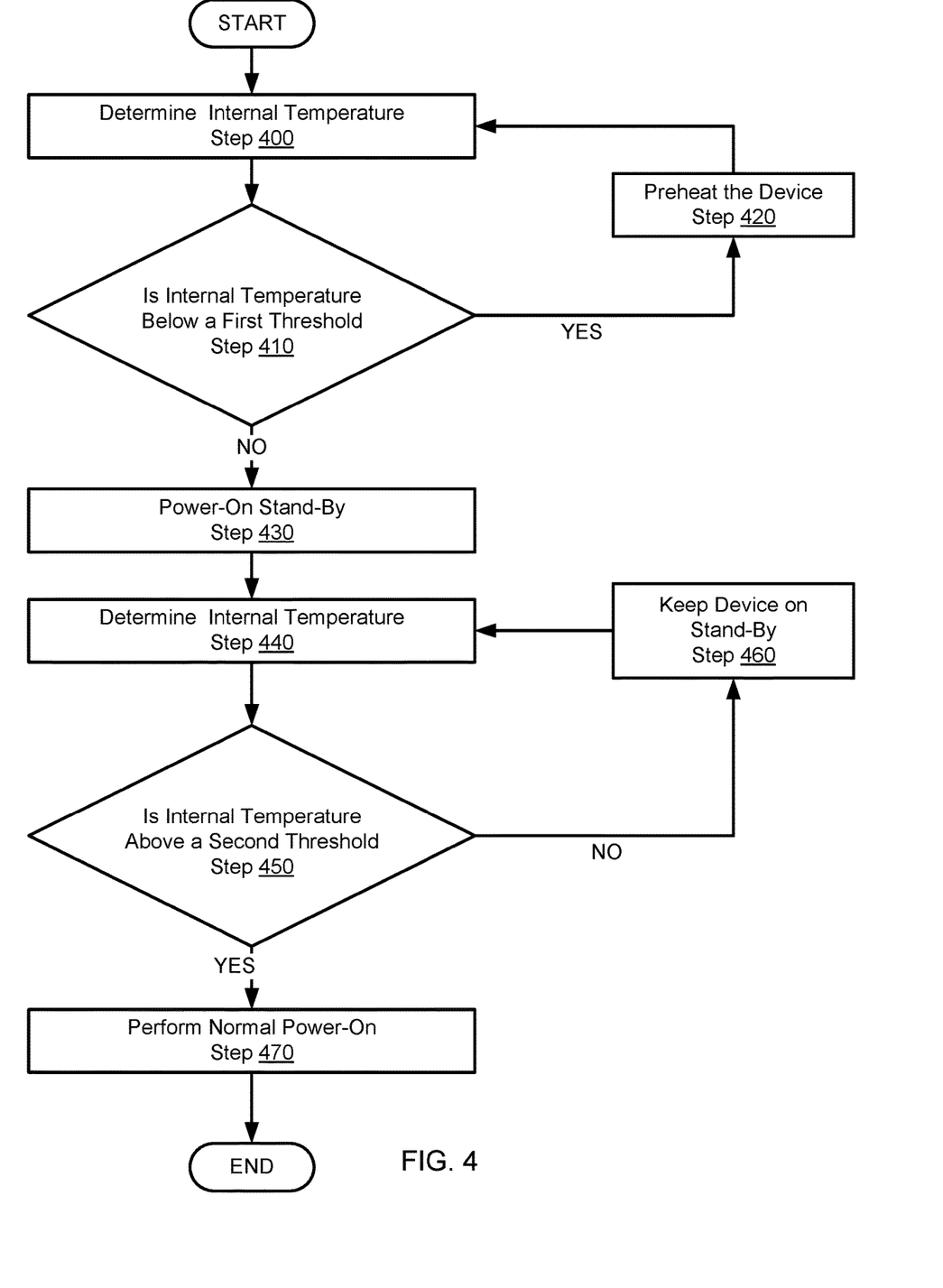
FIG. 4 shows a flowchart of a method for preheating the system in accordance with one or more embodiments of the invention.

A chassis environmental manager (220) analyzes the internal temperature of the internal environment (210) and/or ambient temperatures outside of the chassis (120A) and/or information handling system (100) to perform the methods described in more detail with regards to FIGS. 3 and 4. The chassis environmental manager (220) may control the environmental control components (250), heating elements (280) and may also control the power delivered to individual computing components (240) in order to insure a safe powering-up.

The chassis environmental manager (220) may be implemented using, for example, a digital signal processor, a field programmable gate array, or an application specific integrated circuit. The chassis environmental manager (220) may comprise of a processor and memory that can operate outside of the range of temperatures that other computing components (240) can safely operate. The chassis environmental manager (220) may be implemented using other types of hardware devices without departing from the invention.

In one or more embodiments of the invention, the chassis environmental manager (220) is implemented using computing code stored on a persistent storage that when executed by a processor performs all, or a portion, of the functionality of the chassis environmental manager (220). The processor may be a hardware processor including circuitry such as, for example, a central processing unit or a microcontroller. The processor may be other types of hardware devices for processing digital information without departing from the invention.

The chassis environmental manager (220) and/or computing components (240) may include one or more data structures that include information regarding the environmental conditions within the internal environment (210) of the chassis (120A). For example, when temperature data is read from a detector, the read information may be stored in an environmental condition repository. Consequently, a historical record of the environmental conditions in the repository may be maintained. The historical record of the environmental conditions may include any type and quantity of information regarding the environmental conditions within the repository. For example, an environmental condition repository may include temperature sensor data from discrete temperature sensors and/or temperature sensors integrated into computing components (and/or other types of devices). In another example, the environmental condition repository or any equivalent repository, may include a table of the power level in the form of electrical currents, needed to provide a specific airflow rate as well as changes over time in those currents. The tables may also include initial factory installed temperature thresholds which determine when it is safe to power on the system or individual components, as well as temperature threshold for preheating, or determining it is not safe to power-on any components.

While the data structures stored in storage have been described as including a limited amount of specific information, any of the data structures stored in storage may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, tables, linked lists, databases, or any other type of data structures usable for storage of the aforementioned information.

Alternatively or in addition to, the chassis environmental manager (220) can be part of other components mounted in the chassis (120A), such as the environmental control components (250), heating element (280) or computing components (240). The chassis environmental manager as well as other environmental control components, can also include or comprise of components (not shown) that are not disposed in the chassis (120A). For example, the environmental control components may include an airflow conditioner. These external components may be used in conjunction with the environment control components disposed within the chassis to manage the temperature and/or relative humidity levels throughout the internal environment (210) of the chassis (120A).

The chassis (120A) may include any number and type of environmental control components without departing from the invention. Any of the environmental control components may be implemented using physical devices operably connected to and/or controllable by the chassis environmental manager (220) and/or a system environmental managers that is part of the larger information handling system (alone or in combination). Any number of chassis environmental managers and system environmental managers may cooperatively operate to control the temperature of the internal environments of any number of chassis to manage the thermal load generated by the computing components (240) and/or other components.

The environmental control components (250), heating element (280), and other environmental control components may be physical devices that are able to, at a granular level, modify characteristics of the ambient environment of a set of one or more computing components (240) without affecting the ambient environment of other computing components (240) outside of the set. The environmental control components (250) may be modified in response to a change in ambient environment to enable, or disable, airflow to pass through the set of computing components associated with a specific airflow component. The airflow may be an airflow provided by an airflow component (e.g., a fan forming part of the environmental control components (250)) in the chassis (120A). In enabling, or disabling, the airflow, the temperature of the ambient environment of the set of computing components (240) may be increased or decreased to enable the components in the chassis to operation in the nominal range of temperature that is preferred for operability in the set of computing components.

While the chassis environmental manager (220), temperature sensor (230), environmental control components (250) and heating elements (280) of FIG. 2 have been described and illustrated as including a limited number of specific components for the sake of brevity, these components in accordance with embodiments of the invention may include additional, fewer, and/or different components than those illustrated in FIG. 2 without departing from the invention.

While the chassis (120A) has been illustrated as including a limited number of specific components, a chassis in accordance with one or more embodiments of the invention may include additional, fewer, and/or different components without departing from the invention. Additionally, while the chassis (120A) is illustrated as having a specific form factor (e.g., rack mount), a chassis in accordance with embodiments of the invention may have different form factors without departing from the invention including as a device that can operate by itself with or without a frame (110).

As discussed above, the chassis (120A) may house computing components (not shown). The computing components may enable computing devices to provide services, as discussed above. The computing components may include, for example, packaged integrated circuits (e.g., chips). The computing components may enable any number and type of functionalities to be performed by a computing device.

In one or more embodiments disclosed herein, the computing components in the chassis (120A) include storage that is implemented using devices that provide data storage services (e.g., storing data and providing copies of previously stored data). The devices that provide data storage services may include hardware devices and/or logical devices. For example, storage may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, the computing components in the chassis (120A) may include a memory device (e.g., a dual in line memory device) in which data is stored and from which copies of previously stored data are provided. In another example, the computing components may include a persistent storage device (e.g., a solid state disk drive) in which data is stored and from which copies of previously stored data are provided. In another example, computing components may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Computing components may consume electrical power and generate heat as a byproduct of performing their functionality. Further, the computing components may have some sensitivity to temperature. For example, the computing components may only operate nominally (e.g., as designed) when the temperatures of the respective components are maintained within a preferred temperature range. Consequently, all, or a portion, of the computing components may require some level of cooling and/or heating to continue to operate nominally.

Because the information handling system (100) uses computing components to provide services, the ability of the information handling system (100) to provide services is limited based on the number and/or quantity of computing devices that may be disposed within the chassis. For example, by adding additional processors, memory modules, and/or special purpose hardware devices, the computing device may be provided with additional computing resources which may be used to provide services. Consequently, large number of computing components that each, respectively, generate heat may be disposed within the chassis.

Further, any of the components may be implemented as a service spanning multiple devices. For example, multiple computing devices housed in multiple chassis may each run respective backup power supplies. Each of these instances may communicate and cooperate to provide the functionality of the environmental manager (130).

While the electronic device such as the information handling system (100) and chassis (120A) has been illustrated in FIGS. 1.1, 1.2, and 2 as including specific numbers and types of components, an electronic device in accordance with embodiments of the invention may include different, fewer, and/or additional components without departing from the invention.

FIGS. 3 and 4 show a flowchart of methods in accordance with one or more embodiments of the invention.

The method depicted in FIG. 3 may be used to determine if the ambient temperature associated with an electronic device such as an information handling system (100) of FIGS. 1.1 and 1.2 is sufficient to perform a normal system power-on. The method shown in FIG. 3 may be performed by, for example, the chassis environmental manager (e.g., 220, FIG. 2). Alternatively this can be performed by the device's Basic Input/Out System, (BIOS). Other components of the system illustrated in FIGS. 1.1, 1.2, and 2 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 310, the system is powered on or restored, for example after a power loss. The system may have been powered down previously as part of routine maintenance. Alternatively, it may have been powered down as a result from a problem with the utility providing the power or internal faults in the facility housing the electronic device. When the power is restored or the system is powered on by other means, the method then proceeds to step 320.

In step 320, an ambient temperature associated with the electronic device is determined. This can be done by using the ambient temperature sensor (FIG. 1.2., 170,) which can take a variety of forms such as an external temperature sensor such as a thermocouple or a thermometer. The ambient temperature sensor can be mounted on the housing of the electronic device as shown in FIG. 1.2 or can be mounted elsewhere either inside or outside the housing or facility in which the electronic device is disposed. While a single temperature sensor (170) is shown in FIG. 1.2, the ambient temperature could be determined by finding the average temperature or lowest temperature of a plurality of ambient temperature sensors disposed in various location associated with the electronic device. The ambient temperature can also be the lowest temperature detected over a specific period or may be a historical lowest temperature for a particular time stored in the memory of the electronic device.

In step 330, a chassis environmental manager determines if the ambient temperature from step 320 is within a predetermined range. The range may comprise temperatures between 10° C. to 35° C., which is what server are typically designed. Alternatively, the range could have a lower bound such as 0° C. or even lower in a system that has internal heating. Similarly, the range could have higher bounds in a system that has sufficient cooling for a particular temperature range. In general the range is provided by the manufacturer or by an end user of the electronic device and the ranges can be determined based on the specific electronic device(s) and capabilities of heating elements and cooling elements.

If the ambient temperature is determined to be in the predetermined range, then the method proceeds from step 330 to step 340. In step 340 the system is allowed to perform normal system power-on in accordance to device specific procedures. Alternatively, the method described in FIG. 4 may be performed to ensure a safe and proper start-up.

If the ambient temperature is determined to be outside of the predetermined range, then the method proceeds from step 330 to step 370. In step 370 a user or system environmental manager is alerted that ambient temperature is not in a safe range and the system is not powered on. In at least one embodiment, the alert may take the form of a visual indicator and/or audible alarm. In other embodiments the alerts can take the form of electronic notifications such as but not limited to: emails, SMS messages, and other electronic means of alerting a user and/or supervising system such as an environmental manager.

The method of FIG. 3 may end following either steps 340 or 370.

The method depicted in FIG. 4 may be used to safely perform a system power-on when the internal temperature is below at least a first threshold. The method shown in FIG. 4 may be performed during step 340 of FIG. 3 or may be performed independently or without performing the method of FIG. 3. The method of FIG. 4 may be performed by, for example, the chassis environmental manager (e.g., 220, FIG. 2). Other components of the system illustrated in FIGS. 1.1, 1.2, and 2 may perform all, or a portion, of the method of FIG. 4 without departing from the invention.

While FIG. 4 is illustrated as a series of steps, any of the steps may be omitted, performed in a different order, additional steps may be included, and/or any or all of the steps may be performed in a parallel and/or partially overlapping manner without departing from the invention.

In step 400, an internal temperature is determined. In at least one embodiment this can be done by using a temperature sensor (230) mounted in the internal environment (210) of a chassis (120A). In other embodiments the temperature can be determined by temperature sensors positioned in any useful location in the housing of an electronic device such as in the environmental control components (250), computing components (240), the chassis environmental manager (220), and any other locations and/or parts. The temperature sensor can take a variety of forms such as a thermocouple or a thermometer. The internal temperature could be determined by finding the average temperature or lowest temperature of a plurality of internal temperature sensors. The internal temperature can also be the lowest temperature detected over a specific period or may be a historical lowest temperature for a particular time stored in the memory of the electronic device. Step 400 may not be initially performed if the method in FIG. 4 is performed within step 340. Rather, the first time step 400 is performed, the ambient temperature from step 310 is used; however, in subsequent iterations through FIG. 4 may step 400 may be performed.

In step 410, a processor determines if the internal temperature which was determined in step 400 is below a first threshold. This may be set based on a temperature threshold below which powering on components of the electronic device would result in damage. Such temperature thresholds may be anything below for example 10° C. or 0° C., the specific threshold being set based on the specifics of the electronic device. The threshold may be determined by the manufacturer or may be set by an end user. The threshold can be stored in persistent storage in the electronic device, or else provided to the electronic device or its environmental manager as needed from an external source that takes in account current configurations of the electronic device and historical performance at specific internal temperatures.

If it is determined in step 410 that the internal temperature is below the first threshold, then the method proceeds to step 420. In step 420 the device is preheated using a heating element (280) or by other means of preheating components of the system. This may comprise of heating specific components which are more sensitive to low temperatures individually, heating entire sections, or the entirety of the electronic device. As discussed above with regards to FIG. 2, the heating elements (280) can take a variety of forms. Alternatively, the chassis can be preheated by other means, such as closing dampers to block the flow of ambient air into the electronic device and allow non-cold sensitive components to slowly heat the internal environment. Other means of preheating the device are conceived of and within the scope of the invention.

The method continues to preheat the device and performs steps 400-420 until the Internal Temperature is above the first threshold. When the temperature is above the first threshold, the method in at least one embodiment proceeds to step 430. In an alternative embodiment the method proceeds directly to step 470.

In step 430, the device is put into an intermediary power-on state, such as a stand-by state. At this time some components that are more tolerant of low temperatures are activated; however, the device does not perform a full power-up, until the internal temperature reaches a second threshold as determined in steps 440 and 450. When in stand-by the system may continue to use the preheating of step 420 or alternatively the heater can be turned off and the device can proceed to heat up by the waste heat from those components that have been activated in the stand-by state.

In step 440 the method again determines the internal temperature of the device, using the temperature sensors described with regards to step 400. This internal temperature is compared in step 450 to a second threshold, which is the temperature threshold where it is safe to activate all components of the device and perform normal power-on (step 470). If internal temperature is below the second threshold, the method proceeds to step 460, where the device is kept in standby and steps 440-460 are repeated until the internal temperature is above the second threshold.

Once the temperature is above the second threshold the method proceeds to step 470, and the device performs a normal power-on. The normal power-on places the device in a full performance state and the procedures for performing it are device specific and/or may be based on selections recorded in the device's bios.

The method of FIG. 4 may end following step 470.

Figure 5:
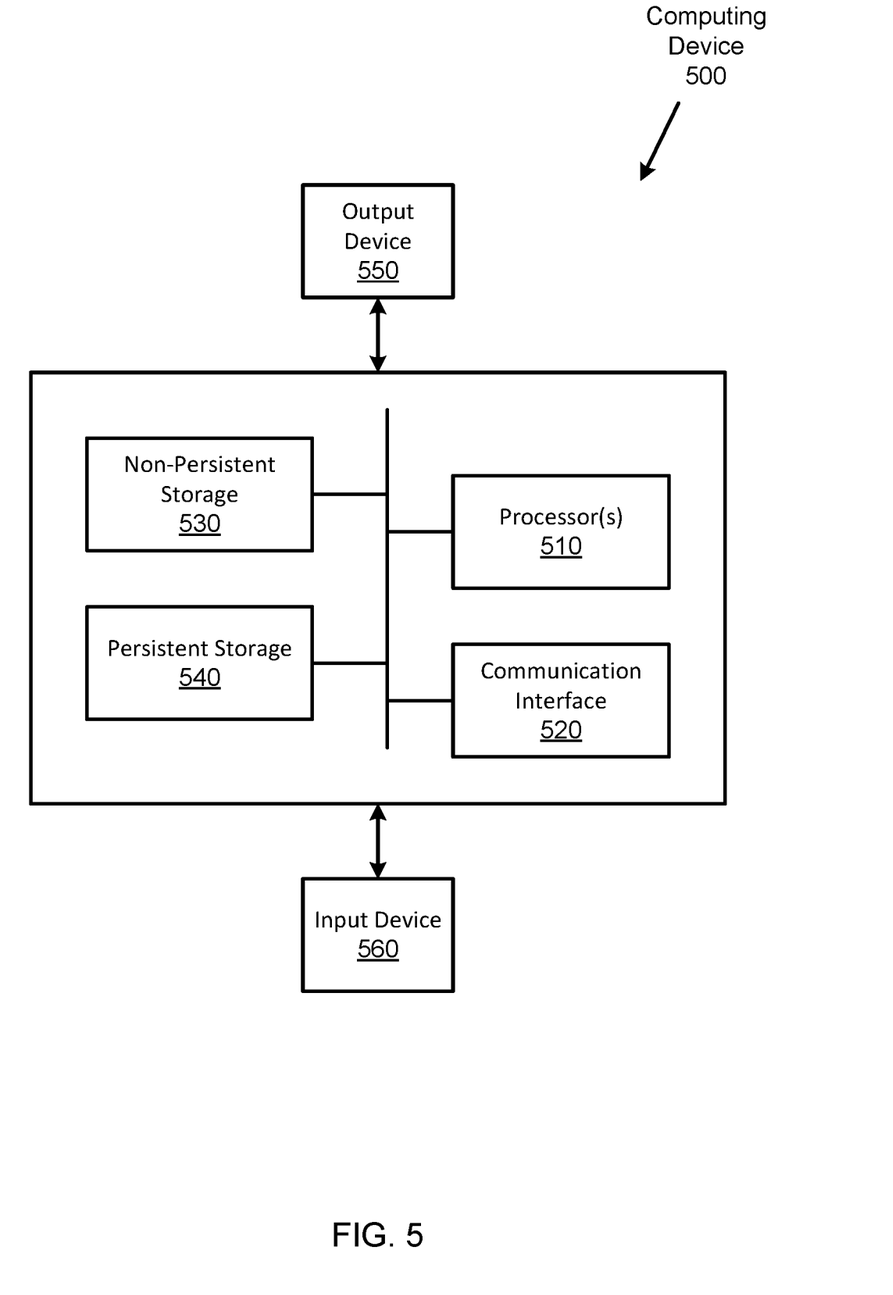
FIG. 5 shows a diagram of a computing device in accordance with one or more embodiments of the invention.

Additionally, as discussed above, embodiments of the invention may be implemented using a computing device. FIG. 5 shows a diagram of a computing device in accordance with one or more embodiments of the invention. The computing device (500) may include one or more computer processors (510), non-persistent storage (530) (e.g., volatile memory, such as random access memory (RAM), cache memory), persistent storage (540) (e.g., a hard disk, an optical drive such as a compact disk (CD) drive or digital versatile disk (DVD) drive, a flash memory, etc.), a communication interface (520) (e.g., Bluetooth interface, infrared interface, network interface, optical interface, etc.), input devices (560), output devices (550), and numerous other elements (not shown) and functionalities. Each of these components is described below.

In one embodiment of the invention, the computer processor(s) (510) may be an integrated circuit for processing instructions. For example, the computer processor(s) may be one or more cores or micro-cores of a processor. The computing device (500) may also include one or more input devices (560), such as a touchscreen, keyboard, mouse, microphone, touchpad, electronic pen, or any other type of input device. Further, the communication interface (520) may include an integrated circuit for connecting the computing device (500) to a network (not shown) (e.g., a local area network (LAN), a wide area network (WAN) such as the Internet, mobile network, or any other type of network) and/or to another device, such as another computing device.

In one embodiment of the invention, the computing device (500) may include one or more output devices (550), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (510), non-persistent storage (530), and persistent storage (540). Many different types of computing devices exist, and the aforementioned input and output device(s) may take other forms.

Embodiments of the invention may provide an improved method for powering on an electronic device such as an information handling system (100) after being powered down or loosing external power, when ambient and internal temperatures are below safe operating ranges. To do so, the system determines if the ambient temperatures are high enough to safely perform a power-on of at least some of the system comprising the electronic device. This may include preheating some of the components and in general following a low temperature power up method. This keeps sensitive components of the computing device, such as processors and memory from suffering damage, by operating them at temperatures that are too cold.

Thus, embodiments of the invention may address the problem of how to power-on an electronic device when the ambient temperature and/or internal temperature is less than the ideal temperature for that device.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for preheating an electronic device, comprising:
    obtaining a first internal temperature of the electronic device, wherein the electronic device comprises a plurality of components;
    making a first determination that the first internal temperature is below a first threshold;
    preheating, in response to the first determination, the electronic device, wherein the preheating is performed by closing dampers to block a flow of ambient air into the electronic device;
    continuing to preheat the electronic device until the temperature is above the first threshold and is below a second threshold;
    powering on the electronic device in an intermediary power-on state when the temperature is above the first threshold and less than the second threshold, wherein a first subset of the plurality of components is powered on during the intermediary power-on state and a second subset of the plurality of components is not powered on during the intermediary power-on state;
    after powering on the electronic device in the intermediary power-on state:
        obtaining a second internal temperature of the electronic device;
        making a second determination that the second internal temperature is above the second threshold; and
        performing, based on the second determination, a normal power-on of the electronic device, wherein the second subset of the plurality of components is powered on during the normal power-on.

2. The method of claim 1, wherein the electronic device is an information handling system.

3. The method of claim 1, wherein the preheating of the electronic device is further performed by a heating element inside the electronic device.

4. The method of claim 1, wherein the preheating of the electronic device is further performed by activating an external heating element.

5. An electronic device comprising:
- at least one sensor for determining an internal temperature;
- a processor that controls the electronic device; and
- a memory having computer program instructions stored thereon, the processor executing the computer program instructions in the memory to perform a method comprising:
  - obtaining a first internal temperature of the electronic device, wherein the electronic device comprises a plurality of components;
  - making a first determination that the first internal temperature is below a first threshold;
  - preheating, in response to the first determination, the electronic device, wherein the preheating is performed by closing dampers to block a flow of ambient air into the electronic device;
  - continuing to preheat the electronic device until the temperature is above the first threshold and is below a second threshold;
  - powering on the electronic device in an intermediary power-on state when the temperature is above the first threshold and less than the second threshold, wherein a first subset of the plurality of components is powered on during the intermediary power-on state and a second subset of the plurality of components is not powered on during the intermediary power-on state;
  - after powering on the electronic device in the intermediary power-on state:
    - obtaining a second internal temperature of the electronic device;
    - making a second determination that the second internal temperature is above the second threshold; and
    - performing, based on the second determination, a normal power-on of the electronic device, wherein the second subset of the plurality of components is powered on during the normal power-on.

6. The electronic device of claim 5, wherein the electronic device is an information handling system.

7. The electronic device of claim 5, wherein the electronic device is part of a chassis in an information handling system.

8. The electronic device of claim 5, wherein the preheating of the electronic device is further performed by a heating element inside the electronic device.

9. The electronic device of claim 5, wherein the preheating of the electronic device is further performed by activating an external heating element.

* * * * *